Aug. 29, 1967 J. A. OLMSTEAD ET AL 3,339,128

INSULATED OFFSET GATE FIELD EFFECT TRANSISTOR

Filed July 31, 1964

*Inventors:*
JOHN A. OLMSTEAD,
JOSEPH H. SCOTT, &
PHILIP KUZNETZOFF.
BY W.S. Hill
Agent United States Patent Office 3,339,128
Patented Aug. 29, 1967

3,339,128

INSULATED OFFSET GATE FIELD EFFECT TRANSISTOR

John A. Olmstead, Somerville, Joseph H. Scott, Newark, and Philip Kuznetzoff, Somerville, N.J., assignors to Radio Corporation of America, a corporation of Delaware Filed July 31, 1964, Ser. No. 386,654
10 Claims. (Cl. 317—235)

Figure 1:
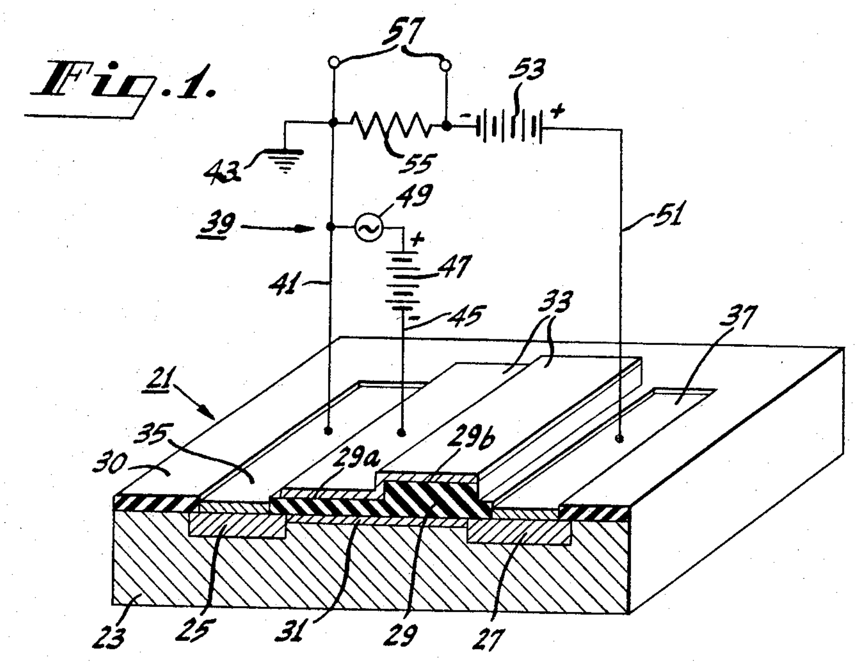

This invention relates to improved field effect transistors of the type having an insulated offset gate.

An insulated gate field effect transistor comprises a channel of semiconductor material and two ohmic connections to the channel at its respective opposite ends, which connections are referred to as the source and the drain. As used herein, the source is the connection from which majority carriers flow into the channel. A field effect transistor includes also a gate opposite and spaced from the channel by insulating material. In a planar type of field effect transistor, the channel, the source, and the drain are constructed along a common plane or surface.

It is known that the electrical characteristics, particularly the highest operating frequency, of a field effect transistor may be improved by reducing the channel length (distance from source to drain) and reducing the gate length (linear dimension of the gate in the direction of the channel length). As a practical matter, these dimensions are limited by the manufacturing technology that is available.

It is also known that the operating characteristics of a planar type field effect transistor for use at higher frequencies may be further improved by offsetting the gate toward the source and away from the drain. In this geometry, there is a portion of the channel adjacent the drain which is not opposite the gate, although insulating material may extend opposite this portion of the channel. It has been found that the characteristics of such a device vary with time and changes in ambient. This variation in characteristics is believed to be due to movements of ions and in variation in the concentrations of these ions on or in the surface of the insulator over the channel portion which is not covered by the offset gate.

An object of this invention is to provide a novel insulated gate field effect transistor.

Another object is to provide an insulated gate field effect transistor having an offset gate in which the operating characteristics vary little or not at all with time or ambient.

In general, the invention includes a field effect transistor comprising a channel, a source and a drain connected to the channel, and an offset gate spaced from the channel by insulating material. The insulating material extends over the entire area between the source and the drain, and is thicker opposite the portion of the channel adjacent the drain and is thinner opposite the portion of the channel adjacent the source. The gate electrode extends over the thinner portion of insulator material. Preferably, the gate extends also over the thicker portion of insulating material. Where the thicker insulator portion is not overlaid by the gate, it may be overlaid by a separate conductor, or may be uncovered.

The devices of the invention are improved over the prior offset gate devices by having greater operational stability. This improved operational stability is achieved by providing the thicker insulator portion adjacent the drain. It is believed that the surface ions, which are believed to cause the operational variations, are displaced further from the channel, where the electric fields therefrom have a lesser influence on the drain current through the channel.

In the embodiments in which the thicker portion of the insulator is covered either by the gate, or by a separate conductor, the ordinarily uncovered insulator is electrostatically shielded, thereby providing an environment which tends further to stabilize the characteristics of the device. The devices of the invention are improved over full gate devices (ones having a gate opposite the entire channel and uniformly spaced therefrom) by having a higher output impendence, a higher breakdown voltage from source-to-drain, and a lower feedback capacitance (capacitance between gate and drain).

Figure 2:
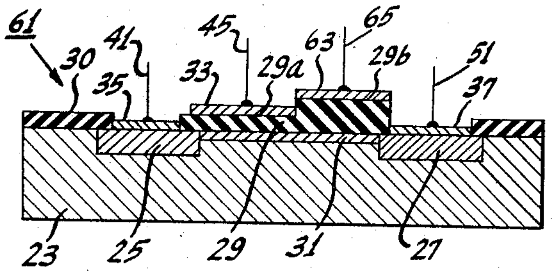
Figure 3:
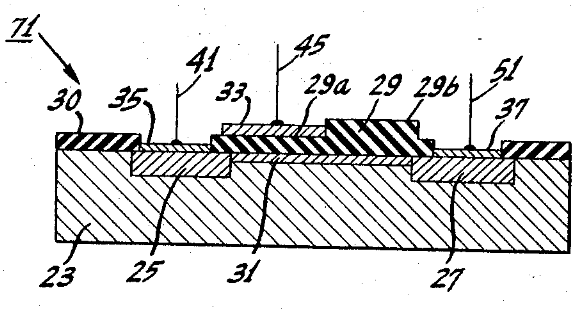

A more detailed description of the invention and illustrative embodiments thereof are described below in conjunction with the drawing in which:

FIGURE 1 is a partially sectional perspective view of a first embodiment of the invention which has a gate extending over both the thinner and thicker portions of insulating material, FIGURE 2 is a sectional view of a second embodiment of the invention having a gate extending over the thinner portion of insulating material, and a separate conductor over the thicker portion of insulating material, and FIGURE 3 is a sectional view of a third embodiment of the invention having a gate extending over the thinner portion of insulating material and with the thicker portion of insulating material uncovered.

Similar reference numerals are used for similar structures throughout the drawings.

FIGURE 1 illustrates an embodiment 21 of the invention having an insulator with a stepped thickness in the direction of current flow through the channel. The device 21 comprises a semiconductor body 23 of resistive P-type silicon, a source region 25 and a drain region 27 of conducting N-type silicon in spaced locations in the body 23. An insulator 29 overlies the region of the body 23 between the source 25 and the drain 27, which region is referred to as the channel 31. The channel 31 is considered to be N-type because the drain currents through the channel are electron currents. The channel 31 may have an excess of electrons when no voltage is applied to the gate, or an excess of electrons may be induced in the channel 31 by applying a positive voltage to the gate. The insulator 29 is preferably of silicon oxide, although other insulators may be used.

The insulator 29 has two different thicknesses or steps **29*a* and 29*b*. The insulator 29 is thinner (portion 29*a*) over the portion of the channel 31 adjacent the source 25 and is thicker (portion 29*b*) over the portion channel 31 adjacent the drain 27. This thicker portion provides an improved operational stability in all of the embodiments of the invention. A gate electrode 33, preferably of metal, rests on the insulator 29 which spaces the gate 33 from the channel 31. The gate 33 may extend only over the thinner portion 29*a* of the insulator 29. It is preferred, as shown in FIGURE 1, that the gate 33 extend over both the thinner and thicker portions 29*a* and 29*b* of the insulator 29. A low resistance source electrode 35 of metal contacts the source 25 and a low resistance drain electrode 37 of metal contacts the drain 27. A layer 30 of insulating material extends over the surface of the body 23 adjacent the source, drain, and gate electrodes. The layer 30** is passive and plays no active part in the operation of the device.

The first embodiment 21 may be operated with a circuit 39 which comprises a source lead 41 connecting the source electrode 35 to ground 43, a gate section comprising a gate lead 45 connecting the gate electrode 33 to ground 43 through a gate voltage supply 47 and a signal source 49 connected in series; and a drain section comprising a drain lead 51 connecting the drain electrode 37 to ground 43 through a drain-to-source voltage supply 53 and a load resistor 55 connected in series. The voltage applied to the gate 33 acts principally through the gate portion over the thinner insulator portion 29*a* and modifies the current passing from the source 25 to the drain 27. The gate portion over the thicker insulator portion 29*b* acts principally as a biased electrostatic shield for further stabilizing the operation of the device. The output signal of the device may be taken across the load resistor 55 at end terminals 57 of the load resistor 55. An amplified replica of the signal applied to the gate 33 from the source 49 appears across the terminals 57. The polarity of the bias and source shown in FIGURE 1 are for operating a device 21 having an N-type channel.

FIGURE 2 illustrates a second embodiment of the invention 61 similar to the embodiment 21 illustrated in FIGURE 1 except that the gate electrode 33 extends only over the thinner portion 29*a* of the insulator 29, and a layer of conductive material 63 separate from the gate electrode 33 extends over the thicker portion 29*b* of the insulator 29. As shown, the conductor 63 is connected with a conductor lead 65. The second emobdiment 61 may be operated in the circuit 39 illustrated in FIGURE 1 with the conductor 63 and the conductor lead 65 floating. Optionally, the conductor lead 65 may be directly connected with the lead 45 so that both the gate 33 and the conductor 63 are at the same voltage. By another alternative, the second embodiment 61 may be operated in the circuit 39 illustrated in FIGURE 1, but with the conductor 63 biased more or less negative with respect to gate 33 (by means not shown) through the conductor lead 65.

FIGURE 3 illustrates a third embodiment 71 of the invention similar to the first embodiment 21 illustrated in FIGURE 1, except that the gate electrode 33 extends only over the thinner portion 29*a* of the insulator 29, and the thicker portion 29*b* of the insulator 29 is not covered by a conductor or a gate. The third embodiment 71 may be operated in the circuit 39 illustrated in FIGURE 1.

The improved operational stability of the device of the invention is achieved by providing in the devices an offset gate and a thicker insulator over the channel portion adjacent the drain as shown in FIGURE 3. The operational stability of the device is further improved by providing an electrostatic shield in the form of a conductor 63 as shown in FIGURE 2. This stabilization may be modified by applying a voltage to the conductor 65 as described above with respect to FIGURE 2. In the embodiment shown in FIGURE 1, the thicker insulator is covered with the gate which is a biased shield.

The circuit 39 illustrated in FIGURE 1 is illustrative of circuits generally that are useful. Other circuits may be used to operate one or more embodiments of the invention. For example, the circuit may be an amplifier circuit in a radio frequency receiver. Further, the signal and voltage sources 47 and 49 each may provide a signal: D.C., low frequency A.C., or high frequency A.C. When so operated, the device and circuit illustrated in FIGURE 1 may function also as a mixer.

As shown in FIGURE 1, the body 23 is floating (not connected to the circuit). Although not shown, the body 23 may also be biased, either with a D.C. or with an A.C. signal to provide an auxiliary signal input to the device. Also, if the body 23 is thin and relatively resistive, an auxiliary gate electrode (not shown) may be positioned adjacent the body 23 opposite the gate 33 to provide an auxiliary signal input.

Embodiments of the invention may include structures having channels constituted of a single crystal, such as silicon produced directly in a single crystal body, or produced epitaxially on a single crystal body. For such single crystal structures, the insulator may be deposited as from a vapor phase or, in some materials such as silicon, may be grown in situ as by thermal oxidation. The embodiments of the invention may include also structures having a channel of polycrystalline material, such as cadmium sulfide, cadmium selenide, or tellurium, preferably produced by deposition from a vapor. For such polycrystalline structures, the insulator is preferably produced by deposition from a vapor. Also, in devices with polycrystalline channels, the channel material may be deposited upon the insulator or the insulator may be deposited upon the channel.

The fabrication techniques for insulated-gate field effect transistors are similar to those used to produce planar bipolar transistors and integrated monolithic devices. Impurity diffusion techniques may be used, and the geometry may be controlled by precision masking and photolithographic techniques.

A fabrication method for a stepped insulator device may be as follows: A lightly doped P-type silicon wafer, about one inch in diameter and 0.007 inch thick, is polished on one side and the surface heavily oxidized in a furnace at about 900° C. containing a steam atmosphere to produce an oxide surface coating. The oxide surface coating that is formed is then etched away in selected areas defined by masking, using photolithographic techniques. Next, the wafer is heated at about 1050° C. for 10 minutes in an atmosphere containing an N-type dopant, such as phosphorus, thereby forming source and drain regions spaced about 0.001 inch apart where the wafer is not covered by the oxide. The entire remaining oxide layer is then removed. Then, the wafer is heated at about 900° C., in wet oxygen gas for about five hours until another, second oxide layer about 4000 A. thick is formed on the surface of the wafer. The wafer is cooled to room temperature and then reheated at about 400° C. in dry hydrogen gas for about 5 minutes to produce a desired channel characteristic. The second oxide layer is selectively removed over the source and drain regions as by etching. The oxide layer over the channel is now stepped by using a series of photolithographic and partial etching operations designed to reduce the oxide thickness. The number of these operations depends upon the requisite number of oxide steps. In this example, two steps for each unit are produced having thicknesses of about 2000 and 4000 A., and lengths of about 0.00025 and 0.00075 inch respectively. Metal is evaporated over the entire wafer, and then selectively etched from all areas of the wafer except over the source region, the drain region and the stepped oxide regions. The metal over the stepped oxide between the source region and the drain region constitutes the gate of the device. The wafer is then diced into separate units or arrays. The units or arrays are mounted on a suitable support and leads are bonded thereto, as by thermal compression. After bonding, the units are encapsulated.

Devices of the invention, prepared as described above, retained within 8%, their initial operating characteristics after 162 hours of operation at room temperature with 16.5 volts applied between source and drain and —22.5 volts applied between source and gate. This is at least a two fold improvement in stability on the average over comparable offset gate devices. At higher operating temperatures the difference in stability between the prior art devices and those embodying the invention was more marked.

What is claimed is:

1. A field-effect transistor comprising a semiconductor channel having respective opposite ends, means at each of said ends for establishing ohmic contact to said channel, and a gate electrode spaced from said channel by insulating material, said insulating material extending over the entire area between said ends of said channel and having a thicker portion opposite the portion of said channel adjacent one of said ends and a thinner portion opposite the portion of the channel adjacent the other of said ends, said gate electrode extending over said thinner portion of insulating material.

2. A field-effect transistor as defined in claim 1, wherein said gate electrode extends over both said thinner and said thicker portions of insulating material.

3. A field-effect transistor as defined in claim 1, further comprising a layer of conductive material separate from said gate electrode over said thicker portion of insulating material.

4. A field-effect transistor comprising a body of semiconductive material having a surface, a channel of controllable conductivity in said body adjacent said surface, said channel having a pair of ends, spaced contact means adjacent said surface for establishing ohmic connection to said channel at each of its ends, an insulator layer on said surface opposite said channel, said insulator layer having a substantially thicker portion over the channel portion adjacent one of said ends and a thinner portion over the channel portion adjacent the other of said ends, and a gate electrode disposed only on the thinner portion of said layer.

5. A field-effect transistor as defined in claim 4, further comprising a layer of conductive material separate from said gate electrode upon the thicker portion of said layer.

6. A field-effect transistor comprising a body of semiconductive material having a surface, a channel of controllable conductivity in said body adjacent said surface, said channel having a pair of ends, spaced contact means adjacent said surface for establishing ohmic connection to said channel at each of its ends, an insulator layer on said surface opposite said channel, said insulator layer having a substantially thicker portion over the channel portion adjacent one of said ends and a thinner portion over the channel portion adjacent the other of said ends, and a gate electrode disposed upon both the thinner and thicker portions of said layer.

7. A semiconductor device including a body of semiconductive material having a surface, a semiconductor channel in said body adjacent said surface, a source region in said body adjacent said surface, said source region being in ohmic contact with said channel, a drain region in said body adjacent said surface, said drain region being in ohmic contact with said channel, biasing means connected to said source region and said drain region for establishing a flow of charge carriers in said channel from said source region to said drain region, an insulator layer on said surface opposite said channel, said insulator layer having a substantially thicker portion over the channel portion adjacent said drain region and a thinner portion over the channel portion adjacent said source region, and a gate electrode on the thinner portion of said layer.

8. A semiconductor device as defined in claim 7, wherein said gate electrode extends over both the thinner and thicker portions of said layer.

9. A semiconductor device as defined in claim 7, further comprising a layer of conductive material separate from said gate electrode on said thicker portion of said layer.

10. A semiconductor device as defined in claim 9, wherein said gate electrode and said layer of conductive material are electrically connected.

No references cited.

JOHN W. HUCKERT, *Primary Examiner.*

R. SANDLER, *Assistant Examiner.*